(12) United States Patent
Mathew et al.

(10) Patent No.: US 6,510,092 B1
(45) Date of Patent: Jan. 21, 2003

(54) ROBUST SHADOW BITLINE CIRCUIT TECHNIQUE FOR HIGH-PERFORMANCE REGISTER FILES

(75) Inventors: Sanu K. Mathew, Hillsboro, OR (US); Ram Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/943,167

(22) Filed: Aug. 30, 2001

(51) Int. Cl.$^7$ .................................................. G11C 7/00
(52) U.S. Cl. ........................................ 365/203; 365/154
(58) Field of Search ................................. 365/203, 204, 365/154, 189.11, 189.12

(56) References Cited

U.S. PATENT DOCUMENTS 5,828,610 A * 10/1998 Rogers et al. ......... 365/189.02
5,870,331 A * 2/1999 Hwang et al. ............... 365/154

* cited by examiner

Primary Examiner—Michael S. Lebentritt
Assistant Examiner—Anh Phung
(74) Attorney, Agent, or Firm—Blakely, Sokoloff, Taylor & Zafman LLP

(57) ABSTRACT

A method and apparatus to improve register file performance. In various embodiments, a shadow bitline runs parallel to a local bitline in a register file, and the shadow bitline is coupled to a subset of the data cells to which the local bitline is coupled. In operation, a static keeper holds the local bitline in a condition complementary to the condition of the shadow bitline, when appropriate.

30 Claims, 5 Drawing Sheets

ROBUST SHADOW BITLINE CIRCUIT TECHNIQUE FOR HIGH-PERFORMANCE REGISTER FILES

FIELD OF THE INVENTION

This invention relates generally to computer systems, and more particularly to register files for use in computer systems.

BACKGROUND

In general, computer systems employ registers to store data. Register files (a collection of registers), in general, are multi-ported memory elements that fall in the performance critical path of general-purpose microprocessors. The demand of having high-speed multi-ported reads and writes generally forces the designer to use dynamic circuit techniques to design high performance register files.

FIG. 1 is an example of a general architecture of a dynamic register file array. The array is broken down into groups, each group typically containing 16 words. As can be seen from FIG. 1, this particular register array has two groups, each containing 16 words, and each word consisting of 32 bits. In operation, the clock delineates the precharge phase and the evaluation phase of the register file array. During the precharge phase, each of the local bitlines is precharged. During the evaluation phase, one of the read select lines is asserted to indicate which of the 32 words in the array is to be evaluated.

Thus, the outputs of each of the data cells in a group are multiplexed together in a dynamic multiplexer to form a local bitline. The local bitlines are then combined and drive a second dynamic multiplexer stage to generate the global bitline signals.

The number of words that can be grouped together is limited by the robustness of the particular register file array. Robustness is a measure of the register file's ability to handle noise such as leakage of current from the local bitline during the evaluation phase. Leakage occurs when current discharges from the local bitline through the n-type metal oxide semiconductor ("NMOS") transistors located in each cell. Leakage is undesirable since it can result in incorrect evaluations if too much current bleeds off of the local bitline during the evaluation phase. In general, a target robustness of 0.14 (e.g., robustness=direct current unity gain noise margin/$V_{supply\ voltage}$) is desired.

In addition, it is desirable to minimize read delay of the register file. Read delay is the time from which the read select for the particular word to be evaluated is asserted until the result is output to the global bitline. However, there is usually a tradeoff between speed and robustness.

For example, if two low threshold voltage transistors are used to discharge the local bitline, the read delay is acceptable, but such an implementation results in 0.0 robustness. In another implementation, two transistors are used (known as dual threshold voltage) to discharge the local bitline, one of the transistors (usually the read select transistor) has a high threshold voltage and the other one (usually the one coupled to the data cell) has a low threshold voltage. In such an implementation, the read delay is 10 percent greater than the read delay of a low threshold voltage implementation, and the robustness is increased to 0.09, which still fails the robustness test. Therefore, both of these implementations fail to achieve the desired robustness of 0.14.

In order to achieve the desired robustness, the dual threshold voltage implementation has been used along with an upsized dynamic keeper, which is circuitry which dynamically holds the local bitline in a precharged condition despite leakage through the pull down transistors. Such an implementation achieves the desired robustness, but the upsized keeper increases the register file read delay to a point which is 24 percent greater than the low threshold voltage implementation, which is much too slow. Furthermore, the dynamic keeper is controlled by the output of the local bitline, which can change state due to noise or leakage. Thus, if the local bitline changes state, the condition is non-recoverable in that the dynamic keeper cannot revert the local bitline output back to the original state.

Moreover, the previously described implementation of register file arrays all use clocks to delineate the precharge and evaluation phases of the register file array. Thus, each local bitline precharge transistor is continually switched regardless of whether the word to be evaluated is located in the particular group to which the local bitline is connected.

DESCRIPTION OF THE DRAWINGS

Various embodiments are illustrated by way of example and not by way of limitation in the figures of the accompanying drawings in which like references indicate similar elements. It should be noted that references to "an," "one," or "various" embodiments in this disclosure are not necessarily to the same embodiment, and such references mean at least one.

DETAILED DESCRIPTION

Various embodiments disclosed herein overcome the problems in the existing art described above by replacing the clock with a more address-specific signal to delineate the precharge and evaluation phases of the register file array and including a shadow bitline which acts in a complementary nature to the local bitline during the evaluation phase to achieve increased robustness along with a decreased register file read delay time. In the following description, for the purposes of explanation, numerous specific details are set forth in order to provide a thorough understanding of the various embodiments. It will be apparent, however, to one skilled in the art that the embodiments may be practiced without some of these specific details. For example, various signals, layout patterns, memory cell configurations and circuits, and logical circuits may be modified according to the teachings of the various embodiments. The following description and the accompanying drawings provide examples for the purposes of illustration. However, these examples should not be construed in a limiting sense as they are merely intended to provide exemplary embodiments rather than to provide an exhaustive list of all possible implementations. In other instances, well-known structures and devices are shown in block diagram form in order to avoid obscuring the details of the various embodiments.

Figure 1:
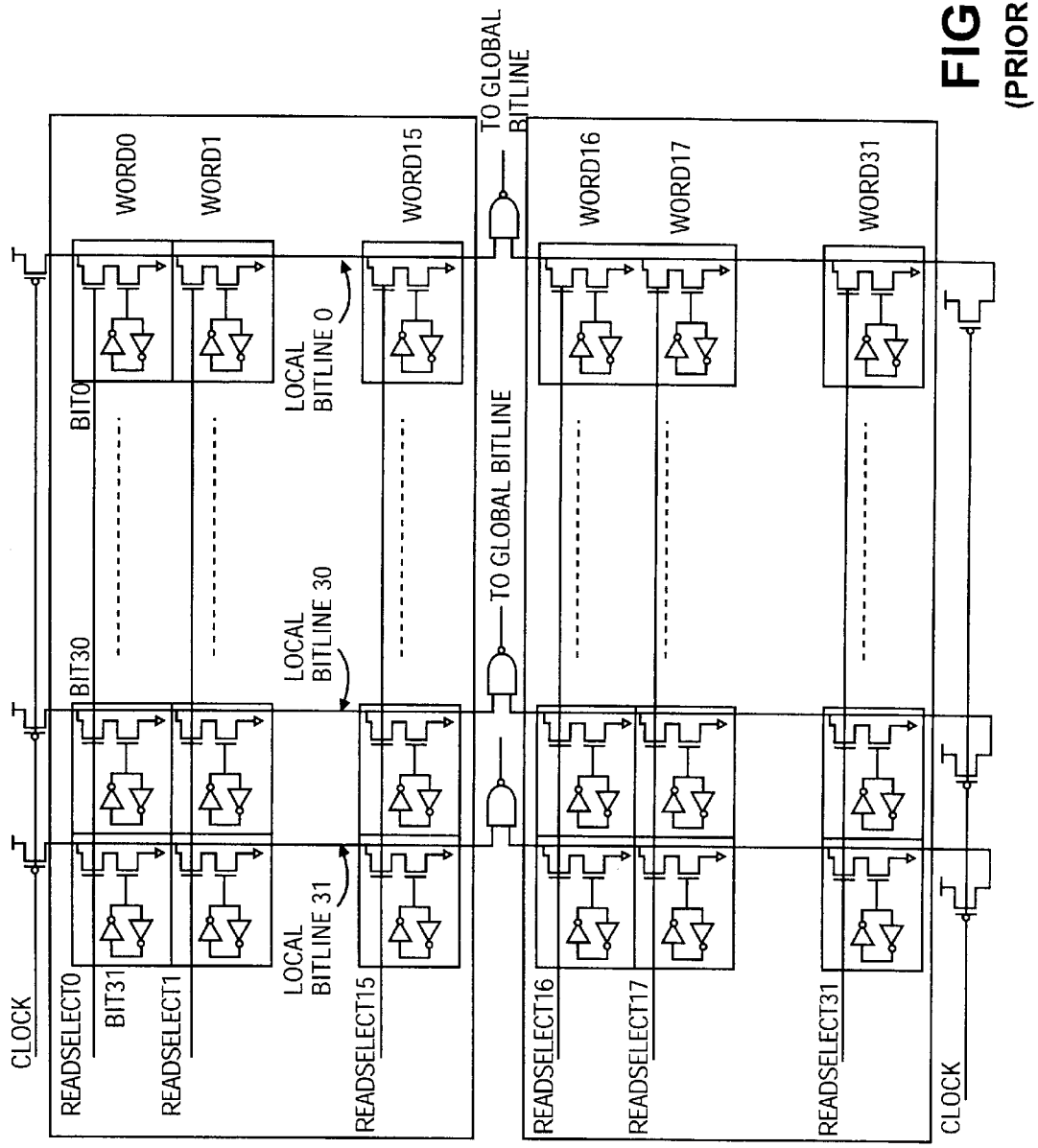
FIG. 1 is a drawing of a register file according to the prior art.
Figure 2:
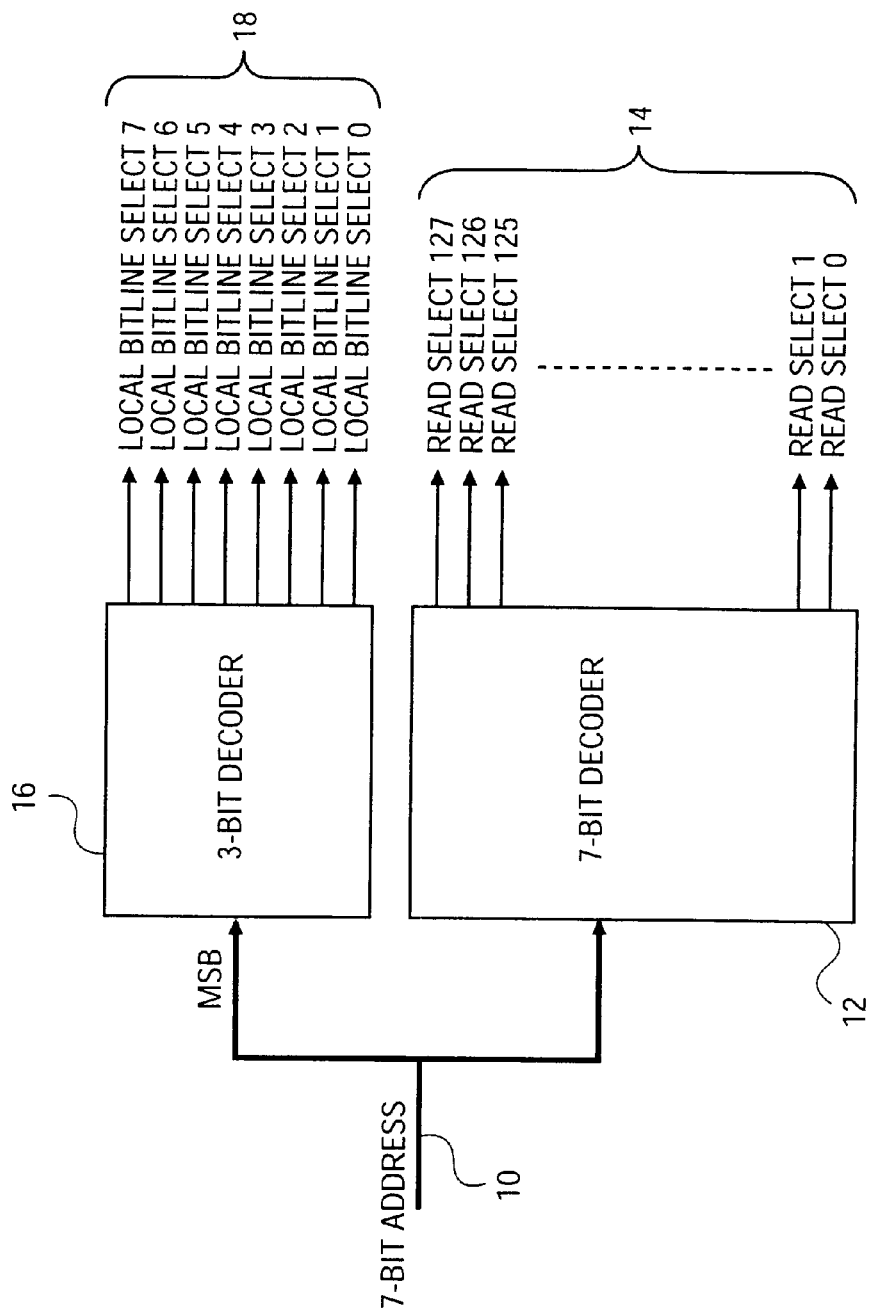
FIG. 2 is a drawing of a split decoder according to one embodiment.

Referring now to FIG. 2, a split decoder is shown which illustrates the manner in which one embodiment generates the signal which replaces the clock of conventional register file arrays. The split decoder receives a 7-bit address on line 10 and sends all seven bits to a 7-bit decoder 12 for generation of Read Select signal 14, which in this embodiment translates to one of 128 possible Read Select signals being asserted in the register file array. In addition, the three most significant bits ("MSB") are sent to a 3-bit decoder 16 to generate Local Bitline Select signal 18, which could be any one of eight Local Bitline Select signals. The split decoder configuration allows for the elimination of needless charging and discharging of groups within the register file array which are not being evaluated. This can be accomplished since Local Bitline Select signal 18 is address specific (based on the three most significant bits of the 7-bit address). Once Read Select signal 14 and Local Bitline Select signal 18 are generated, they are asserted into the register file array.

It is worth noting that although a 7-bit address is shown, it is contemplated to use a different address size and/or a different number of most significant bits.

Figure 3:
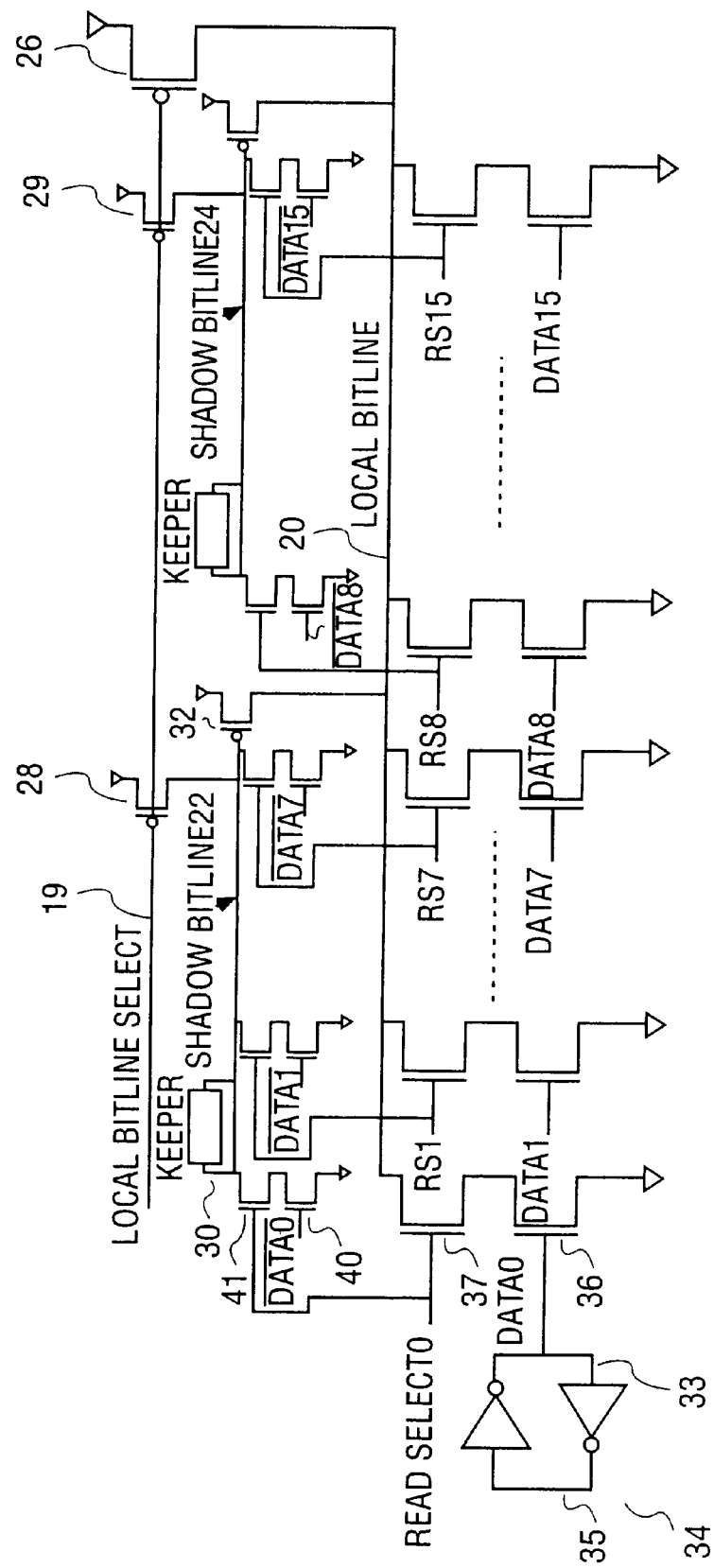
FIG. 3 is a drawing of a local bitline, two corresponding shadow bitlines, and circuitry used to precharge and discharge the local bitline.

FIG. 3 depicts local bitline 20 and shadow bitline 22, which parallels local bitline 20 and shares the same track as shadow bitline 24. Although only one data cell 34 is shown, local bitline 20 is coupled to sixteen data cells 34 of a register file and to shadow bitlines 22 and 24. In addition, each shadow bitline is coupled to a subset of the data cells 34 to which local bitline 20 is coupled. In operation, a p-type metal oxide semiconductor ("PMOS") transistor is used as precharge transistor 26. The gate of precharge transistor 26 is coupled to local bitline select line 19, which carries Local Bitline Select signal 18. In the precharge phase, Local Bitline Select signal 18 is asserted low to the gate of precharge transistor 26 in order to hold precharge transistor 26 in an ON condition so that local bitline 20 is held in a precharged condition. In addition, local bitline select line 19 is also coupled to the gate of transistor 28 and the gate of transistor 29, which control current flow to shadow bitline 22 and shadow bitline 24, respectively. Thus, in the precharge phase, shadow bitline 22, shadow bitline 24, and local bitline 20 are all precharged.

Once Local Bitline Select signal 18 has been generated, as shown in FIG. 2, Local Bitline Select signal 18 is asserted to the gate of precharge transistor 26 and to the gates of transistors 28 and 29. By asserting Local Bitline Select signal 18 high, precharge transistor 26 and transistors 28 and 29 are turned OFF, and in turn, local bitline 20 and shadow bitlines 22 and 24 are released from the precharged condition.

It is to be understood that when Local Bitline Select signal 18 is asserted, a corresponding Read Select signal, generated as shown in FIG. 2, will also be asserted high. For illustration, we will proceed as though Read Select 0 is asserted high along with Local Bitline Select signal 18.

In this case, NMOS transistor 37 will turn ON in response to the assertion of a high Read Select 0 signal which will allow current to flow through transistor 37. However, Data 0 (e.g., the signal from the data cell to be evaluated, here data cell 34) must also be asserted high to the gate of NMOS transistor 36 to allow the charge to continue on through transistor 36. The charge contained within right side 33 of data cell 34 will dictate whether the signal Data 0 asserts to the gate of transistor 36 is high or low (high turning on the transistor, low resulting in an OFF condition and not allowing charge to flow through the transistor).

As can be seen, data cell 34 in this embodiment is comprised of back-to-back inverters such that a high charge stored on left side 35 of data cell 34 would be read as a low charge on right side 33, and vice versa. It is worth noting that a high charge on right side 33 can represent a 1, and a low charge can represent a 0, and vice versa. Thus, charge is related to a value "contained" or "indicated by" data cell 34. As used herein, the value "contained" by right side 33 of data cell 34 is considered to be the value of data cell 34. The value "contained" by left side 35 of data cell 34 is considered to be the inverse of the value of data cell 34.

Thus, if the charge held on right side 33 of data cell 34 is high and Read Select 0 is also high, local bitline 20 is discharged through transistor 37 and transistor 36. However, the embodiment shown behaves in a different manner if the charge on right side 33 of data cell 34 is low.

As stated above, upon assertion of a high Local Bitline Select signal 18, PMOS transistors 28 and 29 release shadow bitlines 22 and 24 from their precharged condition. Once released, shadow bitlines 22 and 24 are capable of working in a complementary nature to local bitline 20. However, only one of shadow bitline 22 and shadow bitline 24 will act in a complementary nature to local bitline 20 since only one will correspond to the particular Read Select signal being asserted. In this example, Read Select 0 is being asserted. Thus, only shadow bitline 22 will act in a complementary nature to local bitline 20.

The complementary functioning is accomplished, in part, by NMOS transistor 41, which has a gate coupled to Read Select 0, and NMOS transistor 40, which has a gate coupled to left side 35 of data cell 34 to read the inverse of the content of right side 33 of data cell 34. Thus, when left side 35 of data cell 34 is charged high, right side 33 of data cell 34 asserts a low signal to NMOS transistor 36, which prevents local bitline 20 from discharging. However, the high signal asserted from left side 35 of data cell 34 to NMOS transistor 40, in conjunction with the high Read Select 0 signal asserted to NMOS transistor 41, causes shadow bitline 22 to discharge. Thus, the embodiment shown in FIG. 3 advantageously employs transistors 40 and 41 to hold shadow bitline 22 low when local bitline 20 is to be held high.

As long as shadow bitline 22 is held low, PMOS transistor 32 remains ON to hold local bitline 20 high for evaluation. Thus, discharged shadow bitline 22 acts in a complementary nature to hold local bitline 20 in the precharged condition when right side 33 of data cell 34 contains a low charge.

It is worth noting that keeper 30 is a conventional dynamic keeper and includes circuitry which is capable of holding the charge on a line high during the evaluation phase. Although not shown in the figures, in various embodiments, keeper 30 includes a PMOS transistor to hold shadow bitline 22 high when local bitline 20 is to be held low, and as discussed previously, since the output of shadow bitline 22 or some variation thereof (e.g., inverse of the shadow bitline) controls keeper 30, keeper 30 is considered "dynamic".

Transistor 32 behaves as a static keeper. When shadow bitline 22 discharges, it turns ON transistor 32 which then holds local bitline 20 high. Transistor 32 is considered a static keeper since it holds local bitline 20 high and is not controlled by local bitline 20 (the output). Rather, transistor 32 is controlled by shadow bitline 22 (the input). Thus, if local bitline 20 changes state due to noise/leakage, transistor 32 will remain ON and restore the state of local bitline 20 to the original precharged value (high). This is possible since transistor 32 is controlled by shadow bitline 22 which has already discharged and is no longer vulnerable to noise/leakage. A dynamic keeper cannot recover from a change of state like a static keeper since the dynamic keeper is controlled by the output, which has already changed to the undesired state.

Additionally, shadow bitline 22, responsible for holding local bitline 20 high, is isolated from noise/leakage from the pull-down transistors which are attached to local bitline 20, which improves the ability of shadow bitline 22 (in conjunction with transistor 32) to hold local bitline 20 high, when necessary.

Figure 4:
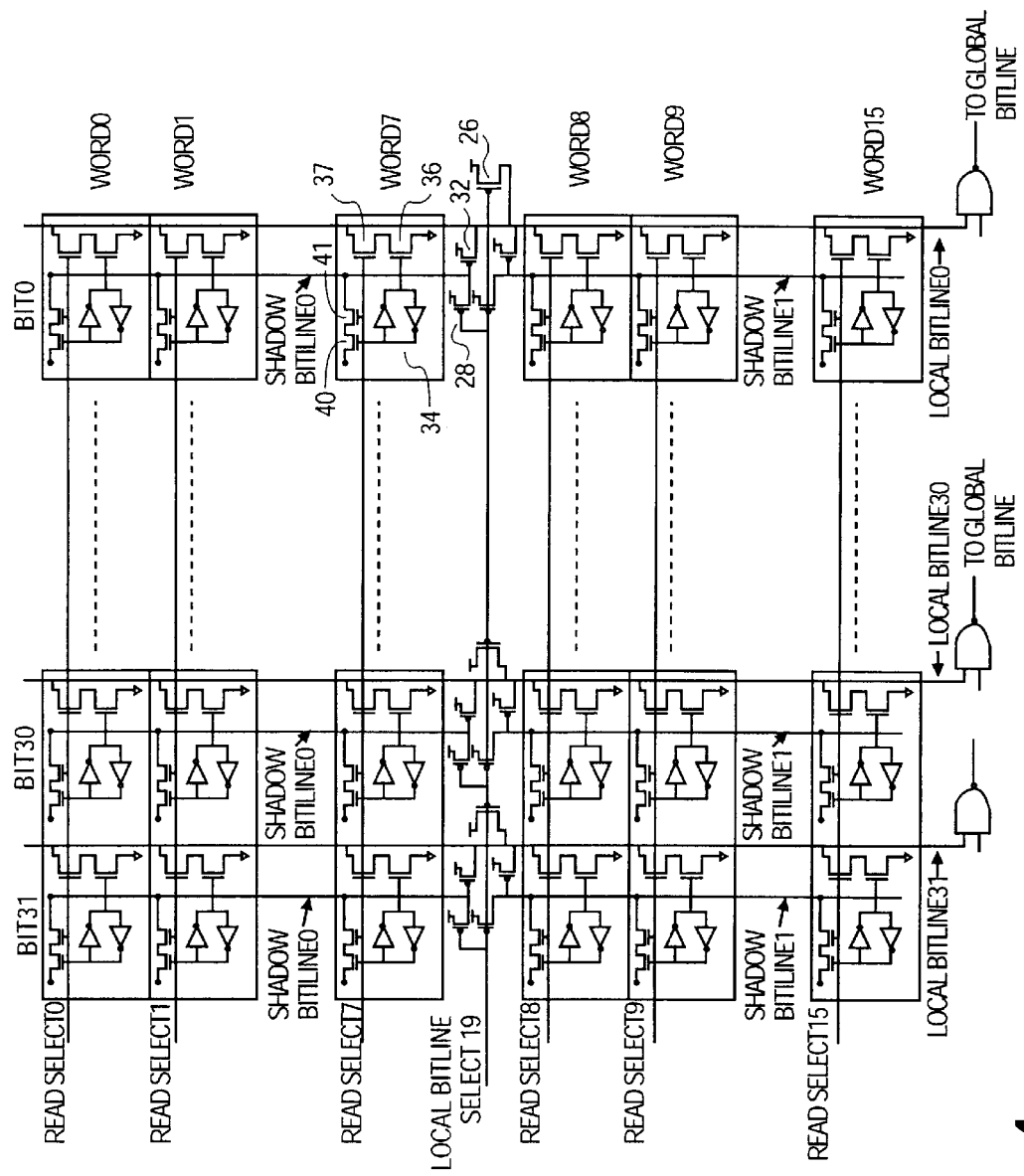
FIG. 4 is a drawing of a register file array according to an embodiment.

FIG. 4 shows a register file array according to an embodiment. As can be seen, local bitline select line 19 is coupled to the gate of PMOS transistor 26. Transistor 26 is used to precharge local bitline 0 and the two shadow bitlines which correspond to local bitline 0. In the embodiment shown, there are two shadow bitlines which share the same track and run parallel to local bitline 0 through the same column of data cells. However, it is worth noting that more shadow bitlines could be used which share the same track and run through the same column of data cells as their respective local bitline.

Figure 5:
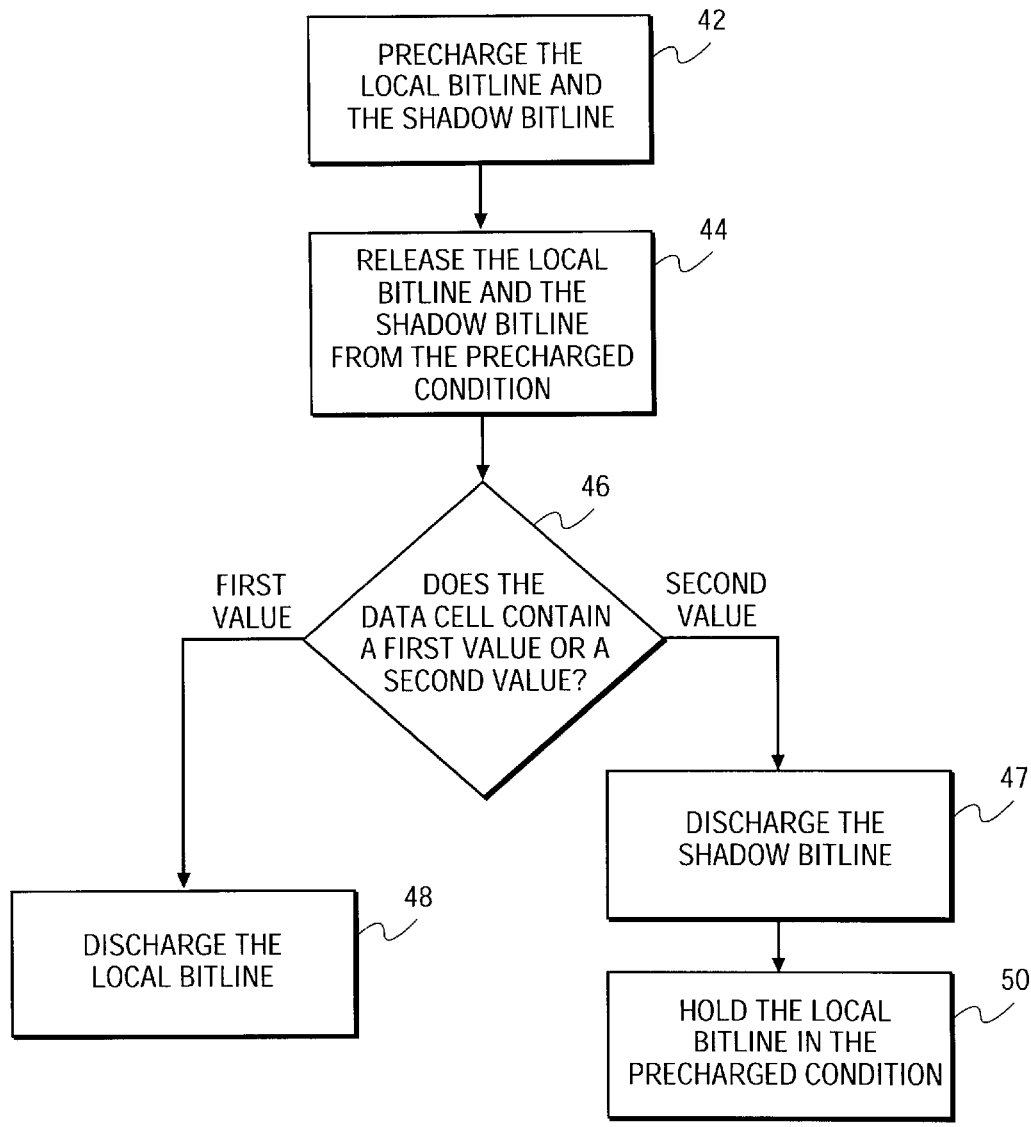
FIG. 5 is a flow chart of a method according to an embodiment.

FIG. 5 is a flow chart of a method according to one embodiment. Initially, at block 42, the local bitline and corresponding shadow bitlines are precharged. At block 44, the local bitline and the corresponding shadow bitlines are released from the precharged condition. At decision block 46, it is determined whether the data cell contains a first value or a second value. If the data cell contains a first value, then the local bitline is discharged at block 48. If the data cell contains a second value, then the shadow bitline is discharged at block 47, and as described above in connection with FIG. 3, discharge of the shadow bitline results in the local bitline being held in the precharged condition at block 50.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claims.

We claim:

1. A method comprising:
   precharging a local bitline and a shadow bitline, the local bitline coupled to a plurality of data cells and to the shadow bitline, the shadow bitline coupled to a subset of the plurality of data cells to which the local bitline is coupled;
   discharging the local bitline if a data cell to be evaluated indicates a first value; and
   holding the local bitline in a precharged condition if the data cell to be evaluated indicates a second value.

2. The method of claim 1, further comprising:
   releasing the local bitline and the shadow bitline from the precharged condition prior to one of discharging the local bitline and holding the local bitline in a precharged condition.

3. The method of claim 2, wherein releasing comprises allowing a precharge transistor to enter an OFF condition.

4. The method of claim 3, wherein allowing comprises generating a high Local Bitline Select signal and asserting the Local Bitline Select signal to a gate of the precharge transistor.

5. The method of claim 1, wherein precharging comprises holding a precharge transistor in an ON condition.

6. The method of claim 5, wherein holding a precharge transistor comprises generating a low Local Bitline Select signal and asserting the Local Bitline Select signal to a gate of the precharge transistor.

7. The method of claim 1, wherein discharging comprises asserting a Read Select signal to circuitry which is coupled to the data cell to be evaluated.

8. The method of claim 1, wherein holding the local bitline in a precharged condition comprises holding the shadow bitline in a condition which is complementary to the precharged condition in which the local bitline is being held.

9. An apparatus comprising:
   a register file containing data cells;
   a local bitline coupled to a plurality of the data cells;
   a shadow bitline coupled to the local bitline and to a subset of the plurality of data cells to which the local bitline is coupled;
   a local bitline select line coupled to the local bitline and to the shadow bitline, the local bitline select line to precharge and release the local bitline and the shadow bitline;
   discharge circuitry coupled to the local bitline to discharge the local bitline from a precharged condition if a data cell to be evaluated indicates a first value; and
   holding circuitry coupled to the local bitline and to the shadow bitline, the holding circuitry to hold the local bitline in the precharged condition if the data cell to be evaluated indicates a second value.

10. The apparatus of claim 9, further comprising a decoder coupled to the local bitline select line and to the discharge circuitry, the decoder to generate a Local Bitline Select signal and a Read Select signal.

11. The apparatus of claim 9, wherein the shadow bitline is coupled to the local bitline by a transistor.

12. The apparatus of claim 9, wherein the shadow bitline comprises a plurality of bitlines which share a common track, and wherein each of the plurality of bitlines is coupled to the local bitline.

13. The apparatus of claim 9, wherein the local bitline select line is coupled to the local bitline by a first transistor and to the shadow bitline by a second transistor.

14. The apparatus of claim 9, further comprising:
   a read select line coupled to circuitry coupled to the data cell to be evaluated, the read select line to indicate which of the data cells is to be evaluated.

15. The apparatus of claim 14, wherein the discharge circuitry comprises:
   the read select line coupled to a gate of a first transistor; and
   the data cell to be evaluated coupled to a gate of a second transistor.

16. The apparatus of claim 14, wherein the holding circuitry comprises:
   the read select line coupled to a gate of a first transistor; and
   the inverse of the data cell to be evaluated coupled to a gate of a second transistor.

17. The apparatus of claim 16, wherein the holding circuitry further comprises circuitry which turns ON in response to a discharge of the shadow bitline, the discharged condition of the shadow bitline to be complementary to the precharged condition in which the local bitline is being held.

18. The apparatus of claim 17, wherein the circuitry which holds the local bitline in a precharged condition comprises a p-type metal oxide semiconductor (PMOS) transistor.

19. The apparatus of claim 18, wherein a gate of the PMOS transistor is coupled to the shadow bitline and a drain of the PMOS transistor is coupled to the local bitline.

20. A system comprising:

a processor;

a memory coupled to the processor, the memory containing data cells;

a local bitline coupled to a plurality of the data cells;

a shadow bitline coupled to the local bitline and to a subset of the plurality of data cells to which the local bitline is coupled;

a local bitline select line coupled to the local bitline and to the shadow bitline, the local bitline select line to precharge and release the local bitline and the shadow bitline;

discharge circuitry coupled to the local bitline to discharge the local bitline from a precharged condition if a data cell to be evaluated indicates a first value; and holding circuitry coupled to the local bitline and to the shadow bitline, the holding circuitry to hold the local bitline in the precharged condition if the data cell to be evaluated indicates a second value.

21. The system of claim 20, further comprising a decoder coupled to the local bitline select line and to the discharge circuitry, the decoder to generate a Local Bitline Select signal and a Read Select signal.

22. The system of claim 20, wherein the shadow bitline is coupled to the local bitline by a transistor.

23. The system of claim 20, wherein the shadow bitline comprises a plurality of bitlines which share a common track, and wherein each of the plurality of bitlines is coupled to the local bitline.

24. The system of claim 20, wherein the local bitline select line is coupled to the local bitline by a first transistor and to the shadow bitline by a second transistor.

25. The system of claim 20, further comprising:

a read select line coupled to circuitry coupled to the data cell to be evaluated, the read select line to indicate which of the data cells is to be evaluated.

26. The system of claim 25, wherein the discharge circuitry comprises:

the read select line coupled to a gate of a first transistor; and the data cell to be evaluated coupled to a gate of a second transistor.

27. The system of claim 25, wherein the holding circuitry comprises:

the read select line coupled to a gate of a first transistor; and the inverse of the data cell to be evaluated coupled to a gate of a second transistor.

28. The system of claim 27, wherein the holding circuitry further comprises circuitry which turns ON in response to a discharge of the shadow bitline, the discharged condition of the shadow bitline to be complementary to the precharged condition in which the local bitline is being held.

29. The system of claim 28, wherein the circuitry which holds the local bitline in a precharged condition comprises a p-type metal oxide semiconductor (PMOS) transistor.

30. The system of claim 29, wherein a gate of the PMOS transistor is coupled to the shadow bitline and a drain of the PMOS transistor is coupled to the local bitline.

* * * * *